US012573019B2

(12) United States Patent
Wu et al.

(10) Patent No.: US 12,573,019 B2
(45) Date of Patent: Mar. 10, 2026

(54) ELECTROPLATING CHAMBER LEAKAGE PLATING WARNING METHOD AND SYSTEM

(71) Applicant: ACM RESEARCH (SHANGHAI), INC., Shanghai (CN)

(72) Inventors: Meng Wu, Shanghai (CN); Zhaowei Jia, Shanghai (CN); Chenhua Lu, Shanghai (CN); Ling Qin, Shanghai (CN); Quan Cao, Shanghai (CN); Hongchao Yang, Shanghai (CN); Jian Wang, Shanghai (CN); Hui Wang, Shanghai (CN)

(73) Assignee: ACM RESEARCH (SHANGHAI), INC., Shanghai (CN)

( * ) Notice: Subject to any disclaimer, the term of this patent is extended or adjusted under 35 U.S.C. 154(b) by 0 days.

(21) Appl. No.: 18/720,388

(22) PCT Filed: Nov. 24, 2022

(86) PCT No.: PCT/CN2022/134105
§ 371 (c)(1),
(2) Date: Jun. 14, 2024

(87) PCT Pub. No.: WO2023/109463
PCT Pub. Date: Jun. 22, 2023

(65) Prior Publication Data
US 2025/0157019 A1      May 15, 2025

(30) Foreign Application Priority Data
Dec. 14, 2021    (CN) .......................... 202111529263.8

(51) Int. Cl.
*G06T 7/00* (2017.01)
*H01L 21/67* (2006.01)

(52) U.S. Cl.
CPC ...... *G06T 7/0004* (2013.01); *H01L 21/67288* (2013.01); *G06T 2207/30136* (2013.01); *G06T 2207/30148* (2013.01)

(58) Field of Classification Search
None
See application file for complete search history.

(56) References Cited

U.S. PATENT DOCUMENTS

2004/0028267 A1    2/2004  Shoham et al.
2004/0154638 A1    8/2004  Reder et al.
(Continued)

FOREIGN PATENT DOCUMENTS

CN    106971955 A    7/2017
CN    107910276 A    4/2018
(Continued)

OTHER PUBLICATIONS

International Search Report issued in Application No. PCT/CN2022/134105, mailed on Jan. 28, 2023 (6 pages).
(Continued)

*Primary Examiner* — Stefan Gadomski
(74) *Attorney, Agent, or Firm* — Osha Bergman Watanabe & Burton LLP

(57) ABSTRACT

An electroplating chamber leakage plating warning method and system are disclosed. The method includes: positioning the electroplated wafer (100) at a detection location (S100); setting a target detection area (S200) of the wafer (100); operating an image sensor (400) to detect the target detection area (S300) of the wafer (100), and determining whether there is unwanted metal deposition in the target detection area of the wafer (100) (S400); if the determination result indicates the presence of unwanted metal deposition in the target detection area of the wafer (100), indicating a leakage plating occurrence in the electroplating chamber processing
(Continued)

the wafer (100), then an alarm command is issued; if the determination result indicates that there is no unwanted metal deposition in the target detection area of the wafer (100), indicating no leakage plating occurrence in the electroplating chamber processing the wafer (100), then no alarm command is issued. By using a detection device to automatically perform leakage plating detection on the wafer (100), it can replace manual inspection of the electroplating conditions of the wafer (100), promptly detect leakage plating issues on the wafer (100), and issue an alarm, facilitating the handling of the electroplating chamber by the staff.

9 Claims, 3 Drawing Sheets

(56)　　　　　　References Cited

U.S. PATENT DOCUMENTS

| | | | |
|---|---|---|---|
| 2005/0218003 A1* | 10/2005 | Wang ........................ | C25F 7/00 |
| | | | 205/157 |
| 2011/0095780 A1* | 4/2011 | Nakata ............... | G01R 31/2887 |
| | | | 324/762.05 |
| 2011/0297839 A1* | 12/2011 | Berauer ................ | H10F 39/189 |
| | | | 438/69 |
| 2012/0062259 A1* | 3/2012 | Yamada ............. | G01R 31/2893 |
| | | | 324/750.25 |
| 2014/0230855 A1* | 8/2014 | Mayer ................ | G01N 21/9501 |
| | | | 356/402 |
| 2014/0266220 A1* | 9/2014 | Thambidurai ......... | C25D 21/12 |
| | | | 324/425 |
| 2021/0158498 A1* | 5/2021 | Saraswatula .......... | G06T 7/0008 |
| 2022/0127459 A1* | 4/2022 | De .......................... | C08L 79/08 |
| 2022/0208580 A1* | 6/2022 | Woo .......................... | G06T 7/70 |
| 2023/0098666 A1* | 3/2023 | Zhu ................... | H01L 21/67259 |
| | | | 134/13 |

FOREIGN PATENT DOCUMENTS

| | | |
|---|---|---|
| CN | 110610880 A | 12/2019 |
| CN | 110799833 A | 2/2020 |
| TW | 201500595 A | 1/2015 |

OTHER PUBLICATIONS

Written Opinion issued in Application No. PCT/CN2022/134105, mailed on Jan. 28, 2023 (3 pages).

\* cited by examiner

ELECTROPLATING CHAMBER LEAKAGE PLATING WARNING METHOD AND SYSTEM

BACKGROUND OF THE INVENTION

Field of the Invention

The present invention relates to the field of semiconductor manufacturing technology, specifically relating to a warning method and system for an electroplating chamber leakage plating.

The Related Art

In the process of manufacturing integrated circuits, many procedures are involved. Among them, the electroplating procedure is an indispensable step in the chip manufacturing process. During the electroplating process, some anomalies often occur, such as leakage plating, electrical discontinuities, abnormal plating height, liquid leakage, etc. Leakage plating, in particular, can lead to lower plating heights. If not detected in time, it can cause entire batches or even multiple batches of wafers to be reworked or scrapped. To timely detect issues with wafer leakage plating, it is necessary to inspect the wafers after electroplating is completed to confirm their condition. Once leakage plating is detected, the corresponding electroplating chamber should be handled by switching its status from production to maintenance.

The method in the prior art for solving the above-mentioned problem is as follows: after the entire batch of wafers has been electroplated, manually inspect the electroplating conditions of the entire batch of wafers to determine if there are any anomalies during the electroplating process. This method has obvious flaws. Firstly, inspecting only after the entire batch of wafers has been electroplated means that once any anomaly occurs, that can lead to the reworking or scrapping of the entire batch of wafers, causing significant losses. Secondly, the inspection of wafer electroplating anomalies requires detailed checks. Using manual inspection is inefficient and costly. Moreover, manual inspection can easily result in errors, leading to misjudgments and missed judgments. Once such errors occur, they may cause multiple batches of wafers to be reworked or scrapped, with incalculable consequences.

Therefore, there is an urgent need for a method that can replace manual inspections and promptly check the electroplating condition of each wafer after plating, inspecting the seed layer at the edge of each wafer. When leakage plating on the edge of a wafer is detected, an alarm should be issued promptly to notify the personnel to handle the electroplating chamber processing that wafer, and to stop any wafer to be plated from entering that electroplating chamber.

SUMMARY

To replace manual inspections and promptly detect leakage plating issues on wafers, as well as handle issues of electroplating chambers, this invention proposes a warning method and system for warning of leakage plating in electroplating chambers.

First aspect, the present invention provides a warning method for warning of leakage plating in electroplating chambers, which includes the following steps:

positioning the electroplated wafer on a fixture at a detection location;

setting a target detection area of the wafer;

operating an image sensor to detect the target detection area of the wafer, determining whether there is unwanted metal deposition in the target detection area;

if unwanted metal deposition exists within the target detection area of the wafer, indicating leakage plating occurs in the electroplating chamber that processed this wafer, an alarm command is issued;

if there is no unwanted metal deposition within the target detection area, indicating no leakage plating in the electroplating chamber that processed this wafer, no alarm command is issued.

According to an embodiment of the present invention, the fixture at the detection location includes:

a separately set installation fixture; or, a wafer chuck inside a cleaning chamber used for the wafer cleaning process.

According to an embodiment of the present invention, the step of operating an image sensor to detect the target detection area of the wafer, and determining whether there is unwanted metal deposition in the target detection area of the wafer further includes:

pre-setting a gray value threshold for the image sensor to issue the alarm command;

the image sensor collects the image of the target detection area of the wafer, generates a target image, and sends the target image to a processor;

the processor receives the target image, performs grayscale processing on the target image, generates gray value data information of the target image, compares the gray value data with the gray value threshold, and generates a comparison result;

if the comparison result is that the gray value is within the gray value threshold range, it indicates there is no unwanted metal deposition;

if the comparison result is that the gray value exceeds the gray value threshold, it indicates the presence of unwanted metal deposition.

According to an embodiment of the present invention, the target detection area of the wafer is set as a circular ring area extending 1.0-2.0 mm from the periphery of the wafer towards the center of the wafer.

According to an embodiment of the present invention, during the process of the image sensor detecting the target detection area of the wafer, the wafer and the image sensor rotate relative to each other.

According to an embodiment of the present invention, the relative rotation speed between the wafer and the image sensor is not more than 50 rpm.

According to an embodiment of the present invention, the image sensor includes: a camera used for collecting the target image.

According to an embodiment of the present invention, when it is determined that a leakage plating phenomenon has occurred in the electroplating chamber, after issuing an alarm command, the method further includes: switching the operational state of the electroplating chamber that processed the wafer to a maintenance-required state, and prohibiting wafers to be electroplated from entering this electroplating chamber.

Second aspect, the present invention provides a warning system for warning of leakage plating in electroplating chambers, including:

a wafer positioning device, for positioning the electroplated wafer at the detection location;

a detection device, for using an image sensor to detect the predefined target detection area of the wafer, determining whether there is unwanted metal deposition within the target detection area; and an alarm device, for issuing an alarm command when unwanted metal deposition is detected within the target detection area of the wafer.

The method and system of the present invention for warning of leakage plating in electroplating chambers enable automatic detection of leakage plating on electroplated wafers, replacing manual inspections, promptly detecting leakage plating issues on wafers, issuing alarms, and facilitating the handling of the electroplating chamber by personnel.

Other features and advantages of this invention will be described in the subsequent description and some will become apparent from the description or can be learned by implementing the invention. The objectives and other advantages of the invention may be realized and obtained through the structures pointed out in the description and drawings.

BRIEF DESCRIPTION OF THE DRAWINGS

In order to more clearly illustrate the technical solutions in the embodiments of the present invention or in the prior art, the drawings required for the description of the embodiments or the prior art are briefly introduced below. It is apparent that the drawings described below are some embodiments of the invention, and for those skilled in the art, other drawings can also be obtained based on these drawings without creative efforts.

DETAILED DESCRIPTION OF EMBODIMENTS

To make the objectives, technical solutions, and advantages of the embodiments of this invention clearer, the following description will combine the drawings in the embodiments of this invention to provide a clear and complete explanation of the technical solutions in the embodiments of this invention. Obviously, the described embodiments are only part of the embodiments of this invention, not all of them. Based on the embodiments in this invention, all other embodiments obtained by those of ordinary skill in the art without making creative efforts are within the scope of protection of this invention.

The present invention proposes an electroplating chamber leakage plating warning method, which includes the following steps: positioning the electroplated wafer at the detection location; setting the target detection area of the wafer; operating an image sensor to detect the target detection area of the wafer, determining whether there is unwanted metal deposition within the target detection area of the wafer, and issuing corresponding feedback commands based on the results of the determination. By automatically inspecting the electroplated wafers in a timely manner, it can replace manual inspection of the electroplating conditions of the wafers, facilitate the timely discovery of leakage plating issues on the wafers, and alert the staff to handle the electroplating chamber.

Figure 1:
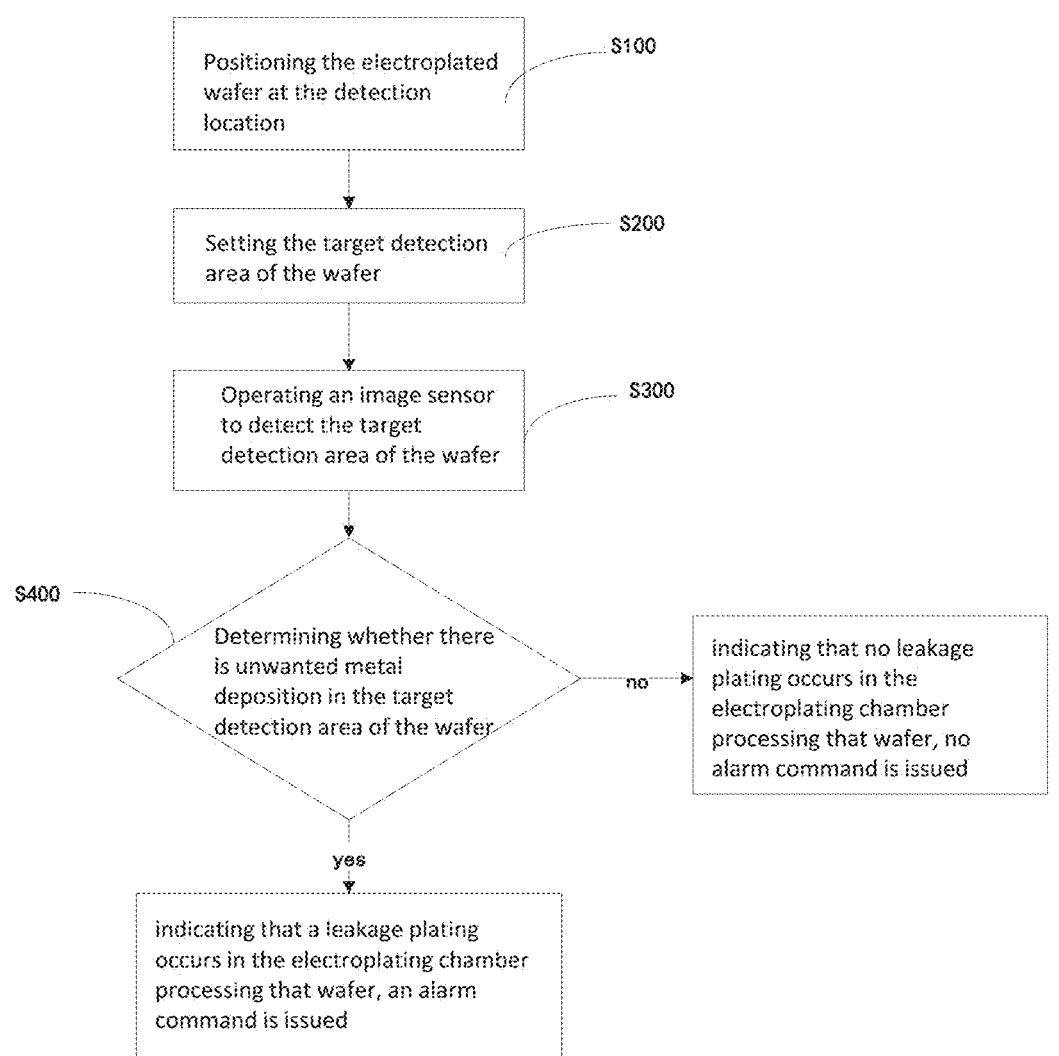
FIG. 1 shows a schematic diagram of an electroplating chamber leakage plating warning method according to an embodiment of the present invention.

Please refer to FIG. 1, which shows a schematic diagram of an electroplating chamber leakage plating warning method according to an embodiment of the present invention. As shown in FIG. 1, the electroplating chamber leakage plating warning method includes the following steps:

S100, positioning the electroplated wafer at the detection location.

After the wafer is electroplated in the electroplating chamber, it is taken from the electroplating chamber and positioned on a fixture at the detection location. The fixture in the embodiment of this invention is a wafer chuck. The wafer is horizontally fixed by pins set on the wafer chuck to facilitate the detection of leakage plating on the wafer. In this embodiment, the fixture is used not only to position the wafer but also to drive the rotation of the wafer, which will be described in detail later.

It is noteworthy that the fixture used for positioning the wafer at the detection location in the present application can be set up as a separate installation fixture independent of the existing wafer processing devices. Alternatively, after the electroplating process is completed, a wafer chuck used in a wafer cleaning process can be served as the fixture for wafer positioning. Utilizing the wafer chuck of the wafer cleaning process as the detection location for the wafer not only effectively utilizes the wafer processing devices, thereby improving the effective utilization rate of the devices; but also eliminates the need for separately setting up fixture for the detection location, thereby saving the wafer transfer procedures. While ensuring the detection of whether the wafer has leakage plating, it effectively improves the processing efficiency of the wafers.

S200, setting the target detection area of the wafer.

Specifically, in the embodiment of this invention, the target detection area of the wafer is set as follows: a certain area on the seed layer at the edge of the wafer is selected as the target detection area. Furthermore, this area specifically is: a circular ring area defined by extending 1.0-2.0 mm from the periphery of the wafer towards the center of the wafer. Even further, it is a circular ring area extending 1.5 mm from the periphery of the wafer towards the center of the wafer.

S300, operating an image sensor to detect the target detection area of the wafer.

Specifically, pre-set a gray value threshold for the image sensor to issue the alarm command;

the image sensor collects an image of the target detection area of the wafer, generates a target image, and sends the target image to a processor.

During the process of the image sensor collecting the image of the target detection area of the wafer, the wafer and the image sensor maintain relative rotation. In the embodiment of this invention, the relative rotation speed between the wafer and the image sensor during the relative rotation process does not exceed 50 rpm. If the relative rotation speed is too high, it will cause the target images collected by the image sensor to be unclear, affecting the accuracy of the results.

Figure 2:
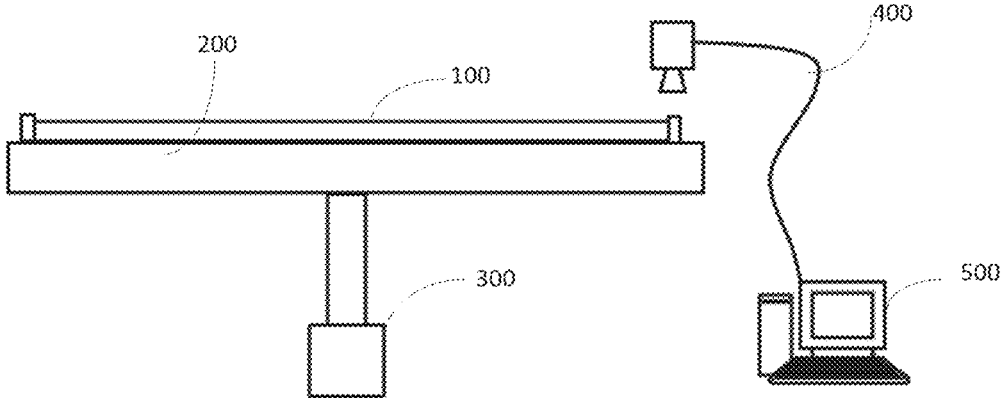
FIG. 2 shows a structural schematic diagram of a leakage plating detection device in an embodiment of the present invention.

While collecting images of the target detection area of the wafer, the wafer can be stationary and the image sensor rotates around the wafer to collect images of the target detection area. Alternatively, the image sensor can be stationary, and the wafer chuck is connected to a driver, which drives the wafer chuck to rotate and thus rotates the wafer, while the image sensor collects images of the target detection area of the wafer in rotating. Alternatively, both the wafer and the image sensor simultaneously move to create relative motion for collecting the images of the target detection area. Exemplarily, the second method is used in the embodiment of this invention for image collect of the target detection area. Specifically, please refer to FIG. 2, which shows a schematic diagram of the leakage plating detection device in an embodiment of this invention. As shown in FIG. 2, the electroplated wafer 100 is horizontally fixed on the wafer chuck 200 by pins, and the wafer chuck 200 is connected to a driving device 300. The driving device 300 drives the wafer chuck 200 to rotate the wafer 100. The image sensor 400 is positioned near the wafer 100, and the angle of image sensor 400 can be adjusted to facilitate image collect of different target detection areas on the wafer 100. The image sensor 400 is connected to the processor 500. In this embodiment of the invention, the processor 500 is a computer. The image sensor 400 in this embodiment is a camera.

The processor 500 receives the target image, performs grayscale processing on the target image, generates a grayscale image of the target image, obtains gray value data information of the grayscale image, compares the gray value data information with the gray value threshold, and generates a comparison result.

S400, determining whether there is unwanted metal deposition in the target detection area of the wafer, and providing corresponding feedback based on the determination results. If the determination result is that the presence of unwanted metal deposition in the target detection area of the wafer, indicating that a leakage plating occurs in the electroplating chamber processing that wafer, an alarm command is issued. If the determination result is that there is no unwanted metal deposition in the target detection area of the wafer, indicating that no leakage plating occurs in the electroplating chamber processing that wafer, no alarm command is issued.

When the determination result is that a leakage plating occurs in the electroplating chamber, after the alarm command is issued, the operational state of the electroplating chamber processing that wafer is switched to a maintenance-required state, and prohibit wafers to be electroplated from entering this electroplating chamber.

Exemplarily, an embodiment of this invention conducts SnAg leakage plating detection on electroplated wafers using the aforementioned electroplating chamber leakage plating warning method. First, a wafer that has completed SnAg electroplating is positioned on the wafer chuck. A circular ring area extending 1.5 mm from the periphery of the wafer towards the center of the wafer is set as the target detection area for checking whether the wafer has SnAg leakage plating. Then, the camera is adjusted to align with the target detection area, and the camera is operated to collect images of the target detection area on the wafer. During the process of image collecting, the drive device connected to the wafer chuck drives the wafer chuck to rotate the wafer at a rotation speed of 25 rpm until the rotation angle of the wafer is greater than or equal to 360°. The camera transmits the collected target image to a computer. The computer performs grayscale processing on the target image, generates a grayscale image of the target image, obtains gray value data information of the grayscale image, compares the gray value data information with the gray value threshold, and generates a comparison result. Exemplarily, the gray value threshold range is 0-200, and in this embodiment, the gray value threshold is set to 30. The gray value of the grayscale image is compared with the gray value threshold.

Determine whether there is unwanted metal deposition in the target detection area of the wafer, and provide corresponding feedback based on the determination results. When the gray value of the target image is greater than or equal to the gray value threshold 30, the determination is that there is unwanted metal deposition in the target detection area of the wafer; if the determination result is the presence of unwanted metal deposition in the target detection area of the wafer, indicating that a leakage plating occurs in the electroplating chamber processing that wafer, an alarm command is issued.

When the gray value of the target image is less than the gray value threshold 30, the determination is that there is no unwanted metal deposition. If the determination result is that there is no unwanted metal deposition in the target detection area of the wafer, indicating that no leakage plating occurs in the electroplating chamber processing that wafer, no alarm command is issued.

Once the determination result is that a leakage plating has occurred within the electroplating chamber, and after issuing the alarm command, the operational state of the electroplating chamber processing that wafer is switched to a maintenance-required state, and wafers to be electroplated are prohibited from entering that electroplating chamber.

Figure 3:
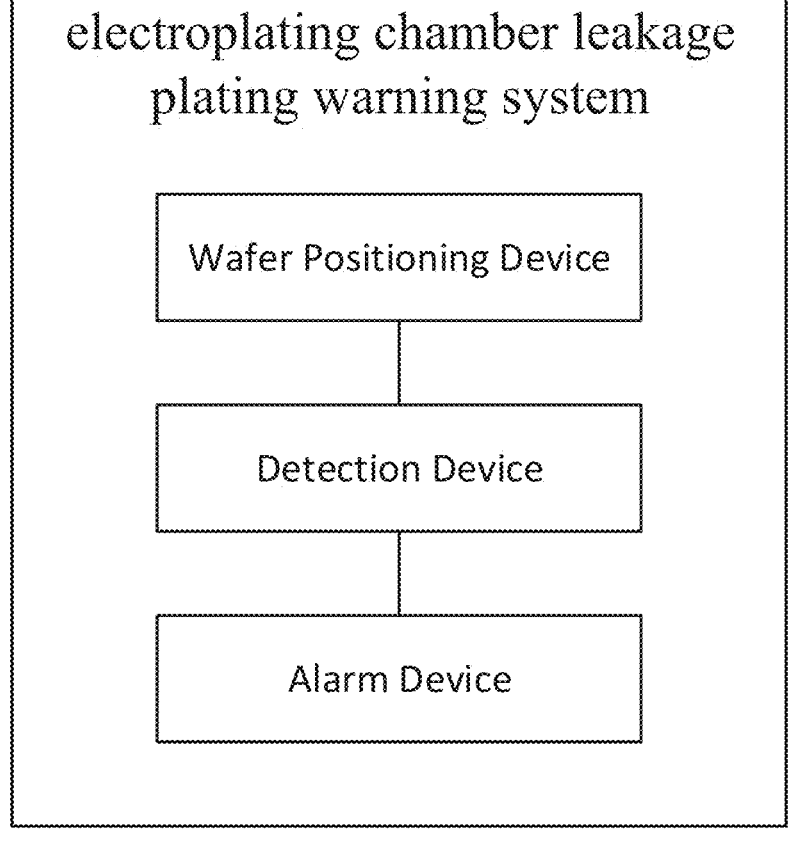
FIG. 3 shows a structural schematic diagram of an electroplating chamber leakage plating warning system according to an embodiment of the present invention.

This invention also provides an electroplating chamber leakage plating warning system. Please refer to FIG. 2 and FIG. 3. FIG. 2 shows a schematic diagram of the leakage plating detection device in an embodiment of this invention. The leakage plating detection device corresponding to the electroplating chamber leakage plating warning system in this embodiment is as shown in FIG. 2, with specific structure details provided in FIG. 2. FIG. 3 shows a schematic diagram of the structure of the electroplating chamber leakage plating warning system. As shown in FIG. 3, this system includes:

a wafer positioning device, used to position the electroplated wafer at the detection location;

a detection device, which uses an image sensor to detect the predefined target detection area of the wafer, determining whether there is unwanted metal deposition in the target detection area of the wafer;

an alarm device, used to issue an alarm command when the determination result indicates the presence of unwanted metal deposition in the target detection area of the wafer.

Although this invention has been described in detail with reference to the aforementioned embodiments, those of ordinary skill in the art should understand that they can still modify the technical solutions recorded in the aforementioned embodiments or equivalently replace some of the technical features; and these modifications or replacements do not deviate from the essence and scope of the technical solutions of the embodiments of this invention.

What is claimed is:

1. An electroplating chamber leakage plating warning method, comprising:

positioning an electroplated wafer on a fixture at a detection location;

setting a target detection area of the wafer;

detecting the target detection area of the wafer, and determining whether there is unwanted metal deposition in the target detection area;

if the determination result is that there is unwanted metal deposition in the target detection area of the wafer, indicating that a leakage plating occurs in the electroplating chamber processing that wafer, then an alarm command is issued;

if the determination result is that there is no unwanted metal deposition in the target detection area of the wafer, indicating that no leakage plating occurs in the electroplating chamber processing that wafer, then no alarm command is issued.

2. The method according to claim 1, wherein the fixture at the detection location includes:

a separately set installation fixture; or a wafer chuck inside a cleaning chamber used for the wafer cleaning process.

3. The method according to claim 1, wherein the step of detecting the target detection area of the wafer, and determining whether there is unwanted metal deposition in the target detection area further includes:

pre-setting a gray value threshold for an image sensor to issue the alarm command;

the image sensor collects the image of the target detection area of the wafer, generates a target image, and sends the target image to a processor;

the processor receives the target image, performs grayscale processing on the target image, generates gray value data information of the target image, compares the gray value data information with the preset gray value threshold, and generates a comparison result;

if the comparison result is that the gray value is within the gray value threshold range, then the result indicates that there is no unwanted metal deposition;

if the comparison result is that the gray value exceeds the gray value threshold, then the result indicates that there is unwanted metal deposition.

4. The method according to claim 1, wherein the target detection area of the wafer is set as: a circular ring area extending 1.0-2.0 mm from the periphery of the wafer towards the center of the wafer.

5. The method according to claim 3, wherein during the process of detecting the target detection area on the wafer, the wafer and the image sensor rotate relative to each other.

6. The method according to claim 5, wherein the relative rotation speed between the wafer and the image sensor is not more than 50 rpm.

7. The method according to claim 3, wherein the image sensor includes a camera for collecting the target image.

8. The method according to claim 1, wherein when the determination result is that a leakage plating occurs in the electroplating chamber, and after issuing the alarm command, the method further includes switching the operational state of the electroplating chamber processing that wafer to a maintenance-required state, prohibiting wafers to be electroplated from entering this electroplating chamber.

9. An electroplating chamber leakage plating warning system, comprising:

a wafer positioning device, used to position the electroplated wafer at the detection location;

a detection device, used to detect the target detection area of the wafer, determining whether there is unwanted metal deposition in the target detection area of the wafer;

an alarm device, used to issue an alarm command when the determination result indicates the presence of unwanted metal deposition in the target detection area of the wafer.

\* \* \* \* \*